US011355578B2

(12) United States Patent
Sizov et al.

(10) Patent No.: US 11,355,578 B2
(45) Date of Patent: Jun. 7, 2022

(54) HIGH VOLTAGE DEVICE

(71) Applicant: X-FAB Dresden GmbH & Co.KG, Dresden (DE)

(72) Inventors: Victor Sizov, Dresden (DE); Denis Reso, Dresden (DE)

(73) Assignee: X-FAB DRESDEN GMBH & CO.KG, Dresden (DE)

( * ) Notice: Subject to any disclaimer, the term of this patent is extended or adjusted under 35 U.S.C. 154(b) by 0 days.

(21) Appl. No.: 16/749,605

(22) Filed: Jan. 22, 2020

(65) Prior Publication Data
US 2020/0235197 A1    Jul. 23, 2020

(30) Foreign Application Priority Data

Jan. 23, 2019   (GB) .................................. 1900931

(51) Int. Cl.
| H01L 21/00 | (2006.01) |
| H01L 49/02 | (2006.01) |
| H01L 21/02 | (2006.01) |
| H01L 21/8234 | (2006.01) |
| H01L 29/40 | (2006.01) |
| H01L 27/06 | (2006.01) |
| H01L 27/092 | (2006.01) |
| H01L 21/8238 | (2006.01) |

(52) U.S. Cl.
CPC ........ *H01L 28/60* (2013.01); *H01L 21/02112* (2013.01); *H01L 21/823481* (2013.01); *H01L 21/823878* (2013.01); *H01L 27/0629* (2013.01); *H01L 27/0922* (2013.01); *H01L 29/402* (2013.01)

(58) Field of Classification Search
CPC .............. H01L 28/50; H01L 21/02112; H01L 21/823481; H01L 21/823878; H01L 27/0629; H01L 27/0922; H01L 29/402
See application file for complete search history.

(56) References Cited

U.S. PATENT DOCUMENTS

| 5,223,729 | A  | 6/1993  | Kudoh et al. |
| 8,643,138 | B2 | 2/2014  | Dong |
| 9,583,558 | B2 | 2/2017  | West et al. |
| 2003/0231455 | A1 | 12/2003 | Devoe |
| 2007/0069274 | A1 | 3/2007  | Elsass et al. |
| 2007/0148895 | A1 | 6/2007  | Van Schuylenbergh et al. |
| 2010/0258806 | A1 | 10/2010 | Nakayama et al. |
| 2014/0183698 | A1 | 7/2014  | Hsu et al. |
| 2015/0022948 | A1 | 1/2015  | An et al. |

OTHER PUBLICATIONS

Search Report dated May 10, 2019 is GB1900931.5, 4 pages.

*Primary Examiner* — Richard A Booth
(74) *Attorney, Agent, or Firm* — Nixon & Vanderhye PC (57) ABSTRACT

We disclose herein a high voltage device comprising: a first electrode; a second electrode disposed underneath and spaced from the first electrode; and a dielectric layer disposed between the first and second electrodes, wherein the first electrode extends further in at least one lateral direction in respect of the second electrode.

19 Claims, 8 Drawing Sheets

HIGH VOLTAGE DEVICE

This application claims priority to GB Application No. 1900931.5 filed Jan. 23, 2019, the entire contents of which are hereby incorporated by reference.

TECHNICAL FIELD

The present disclosure relates to a high voltage (H V) component or device for a microelectronic device, particularly but not exclusively, to a galvanic isolation device.

BACKGROUND OF THE DISCLOSURE

For several applications a high isolation capability between metal plates may be a key requirement. For galvanic isolation applications the requirements for the strength of isolation can be above 5 kV RMS (root mean square). It may be difficult or even not possible to achieve such level of isolation with the limitation of the isolation (dielectric) layers capability of available wafer fab processes. This is because the stacking of the Inter Metal Dielectric layers in a CMOS process limits the isolation thickness to a few microns only, which is not sufficient to achieve a high enough isolation strength. Therefore, there is a requirement for an improved device design to help to redistribute electrical field and to avoid/reduce high peak values of electrical field over the device.

U.S. Pat. No. 9,583,558 B2 is related to supporting lateral isolation between HV components (for example HV capacitors) and a low voltage (LV) side (logic, gate driver and etc.). HV capability is enhanced using a dielectric stack consisting of different dielectric materials. In U.S. Pat. No. 8,643,138 two isolation capacitors are used in series to increase breakdown voltage.

Figure 1:
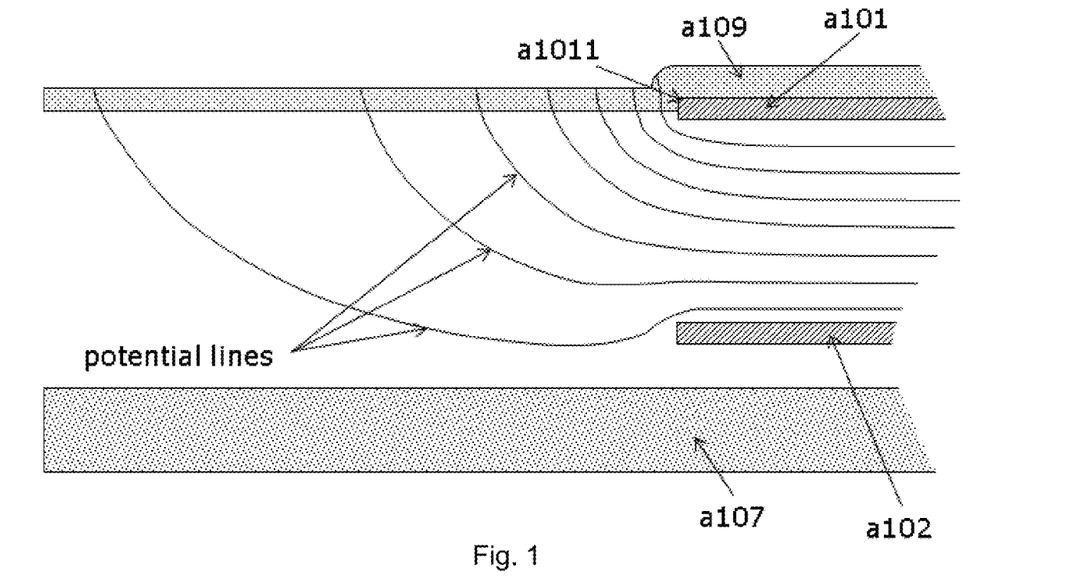
FIG. 1 illustrates a simulation of equipotential lines of the electric field a conventional HV component.

FIG. 1 illustrates a simulation of equipotential lines of the electric field of a conventional HV component with vertically stacked nodes. In CMOS processes, semiconductor substrates are usually used to create microelectronic circuits. In a device such as that shown in FIG. 1, the semiconductor substrate a107 itself has an effect like a wide lateral extension of the main plate a102 of the LV node. As a result, the electrostatic potential is not distributed symmetrically between the HV node a101 and LV node a102 when a voltage is applied. Especially at the edges of the nodes the potential lines are bent differently for HV and LV nodes. The bending around the edge a1011 of the HV node a101 is much tighter than around the edges of the LV node. Further, a tighter bending of the potential lines also comes along with decreased distances between them and therefore also with an increased strength of the electric field. A high local electric field can induce an electrical breakdown of the dielectric and subsequently of the whole HV component. Hence, in this device, the breakdown would be induced at the edge a1011 of the HV node's main plate a101.

SUMMARY OF THE DISCLOSURE

Aspects and preferred features are set out in the accompanying claims.

The present disclosure relates to a HV component (for example a capacitor or a transformer) which delivers an improved r performance in terms of isolation strength and reliability compared to a conventional two nodes approach without adding thickness of dielectric between nodes or increasing the process complexity.

The advantages of the disclosed device include:
The device can be realized in the scope of standard back end of line (BEOL) technology,
The device achieves a significant isolation strength improvement compared to the conventional approach with the same isolation dielectric thickness.
Cheaper process costs for the same isolation class are achieved compared to conventional designs,
The features of the disclosed device can be applied/combined with any other approaches, for example they can be used in an integrated on chip solution.

The HV component disclosed overcomes the inherent asymmetric geometry of the nodes of conventional devices, and balances the electric field at the node edges. This balancing of electric field results in greatly enhanced isolation strength of the HV component while using the same dielectric thickness between the HV and LV nodes.

The HV component may be a micro-transformer or a parallel plate capacitor, and can withstand very high voltages.

According to one aspect of the present disclosure, there is provided a high voltage device comprising: a first electrode; a second electrode disposed underneath and spaced from the first electrode; and a dielectric layer disposed between the first and second electrodes, wherein the first electrode extends further in at least one lateral direction in respect of the second electrode. This allows the electric field at the edges of the electrodes to be balanced compared with devices where the first electrode does not extend past the second electrode. This results in increased isolation strength of the HV component, and allows the device to withstand higher voltages.

The first electrode may comprise a first portion and a second portion, and the first portion may be located above the second electrode, and the second portion may not be located above the second electrode. In other words, part of the first electrode may be located over the second electrode, and part of the first electrode may extend past the edge of the second electrode so that the first electrode overhangs the second electrode. The overhang of the first electrode over the second electrode compensates the asymmetric distribution of the electrostatic potential. The first portion of the first electrode and the second portion of the first electrode may not be physically separate but may define different areas within the first electrode.

The first electrode and the second electrode may comprise capacitor plates. In this configuration, the device may be a parallel plate capacitor.

Alternatively, the first electrode and the second electrode may comprise transformer coils. In this configuration, the device may be a micro-transformer.

The device may further comprise a semiconductor substrate located under the second electrode. The substrate may be electrically floating. Alternatively, the substrate may be electrically connected to the second electrode.

The first electrode may be configured to be biased at a higher absolute voltage than the second electrode.

The device may further comprise a first field plate electrically connected to the first electrode. The introduction of the first field plate allows an additional reduction of the electric field edge of the first electrode. The first field plate may extend further in at least one lateral direction in respect to the first electrode. The extension of the first field plate past the edge of the first electrode helps to further reduce the electric field at the edge of the first electrode.

The device may further comprise a second field plate electrically connected to the second electrode. The introduction of the second field plate reduces the electric field at the edge of the second electrode, for higher values of distance between the edge of the first electrode and the edge of the second electrode whilst maintaining the reduced electric field at the edge of the first electrode. The second field plate may extend further in at least one lateral direction in respect to the second electrode. With a positive overlap over the edge of the second electrode, the second field plate is able to reduce the electric field at the edge of the second electrode.

The device may further comprise a passivation layer located above the first electrode.

The device may be manufactured using a complementary metal oxide semiconductor (CMOS) compatible process.

Advantageously, at least one electrode may comprise a rounded corner in a vertical direction. The introduction of a rounded corner further reduces electric field at that corner. This is because electric field at the corner is proportional to the corner radius to the power of (−1). Preferably, a corner on a lower edge of the first electrode may have a rounded shape, and a corner on an upper edge of the second electrode may have a rounded shape. The corners on a lower edge of the first electrode on an upper edge of the second electrode have the highest electric field, therefore rounding these corners further improves the high voltage capability of the device.

Preferably, at least one electrode may comprise a rounded corner in a lateral direction. The introduction of a rounded corner further reduces electric field at that corner.

More preferably, at least one electrode may have a substantially circular shape in a lateral dimension. The electric field at the corner is proportional to the corner radius to the power of (−1), therefore a circular shape further improves reduction in electric field.

Advantageously, the first electrode and the second electrode may have a geometrically similar shape in a lateral dimension. Additionally, the first electrode and the second electrode may be arranged concentrically in a lateral dimension. These features of the structure reduce non-uniform field redistribution, and avoid the creation of a "hot spot" of the electric field.

The device may be a galvanic isolation device.

According to a further aspect of the present disclosure, we provide a method of manufacturing a high voltage semiconductor based device. The method comprises forming a first electrode; forming a second electrode disposed underneath and spaced from the first electrode; and forming a dielectric layer disposed between the first and second electrodes; wherein the first electrode extends further in at least one lateral direction than the second electrode.

BRIEF DESCRIPTION OF THE PREFERRED EMBODIMENTS

Some preferred embodiments of the disclosure will now be described by way of example only and with reference to the accompanying drawings, in which:

FIGS. 3(a)-3(c) illustrate simulations of the distribution of electrostatic potential for different overlap values between a first (top) electrode and a second (bottom) electrode within HV components;

FIGS. 10(a)-10(b) illustrate plan views of examples of a capacitor layout design, according to further embodiments of the disclosure;

FIGS. 13(a)-13(c) illustrate different shapes of main plate and field plate corners according to embodiments of the disclosure;

DETAILED DESCRIPTION OF THE PREFERRED EMBODIMENTS

Figure 2:
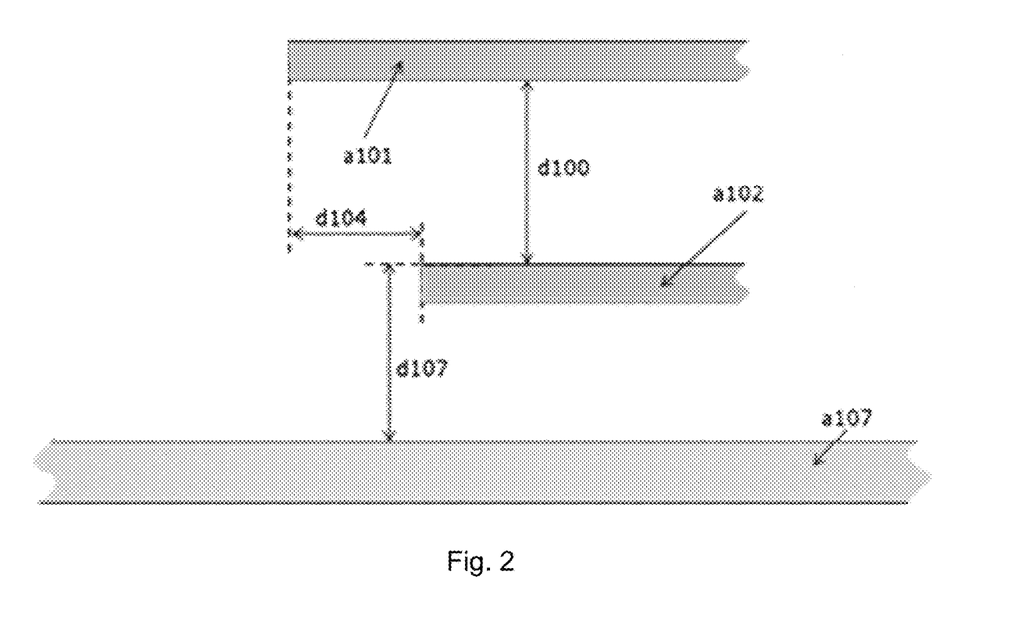
FIG. 2 shows a schematic illustration of a HV component, according to one embodiment of the disclosure.

FIG. 2 shows a schematic illustration of a HV component, according to one embodiment of the disclosure. In this embodiment, the component has a high voltage (HV) node including a first electrode or first main plate a101, and a low voltage (LV) node including a second electrode or second main plate a102 formed over a substrate a107. In one example, the electrodes may be coils in a transformer, or may be plates in a parallel capacitor. The first electrode is configured at a higher absolute voltage than the second electrode. There is a positive overlap of distance d104 of the HV node's main plate a101 over the LV node's main plate a102. This compensates the asymmetric distribution of the electrostatic potential. There may be a connection that ties the LV node a102 and the substrate a107 on a similar electrostatic potential or the substrate a107 may be left floating.

Figure 3A:
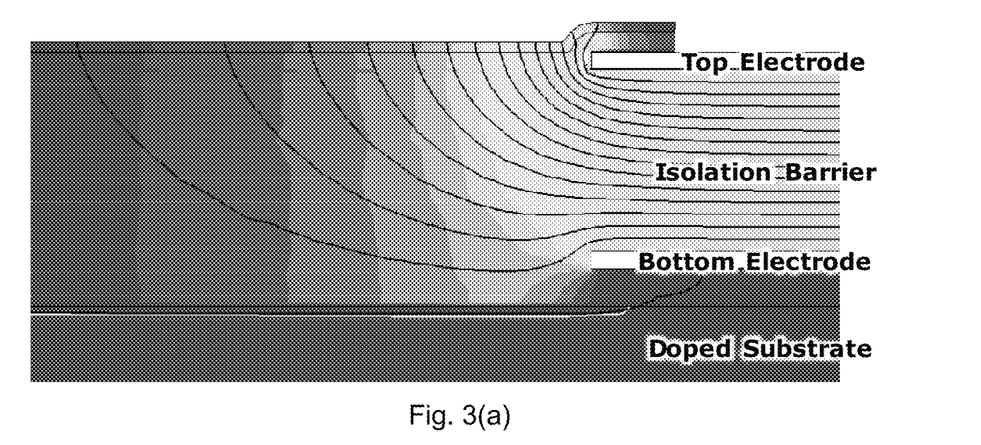
FIG. 3(a) illustrates a simulation of electrostatic potential distribution within a component with symmetrical first and second electrodes.
Figure 3B:
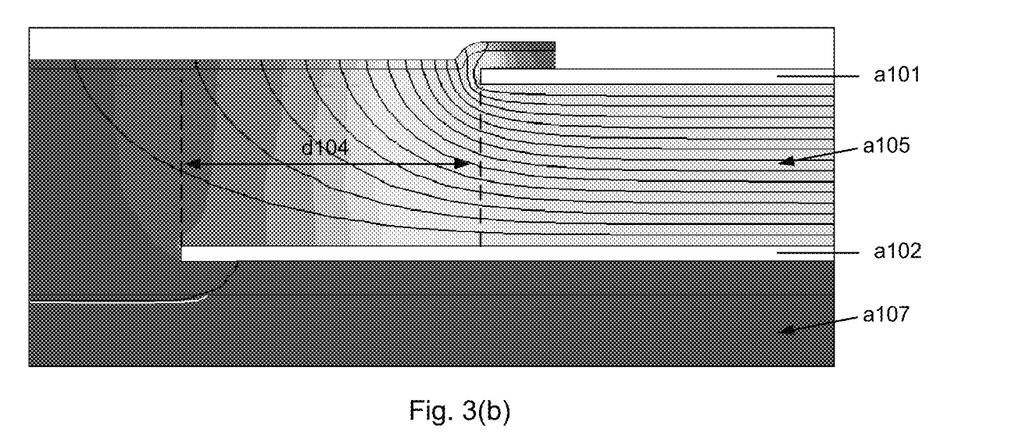
FIG. 3(b) illustrates a simulation of electrostatic potential distribution within a component where the second (bottom) electrode extends beyond the first (top) electrode.
Figure 3C:
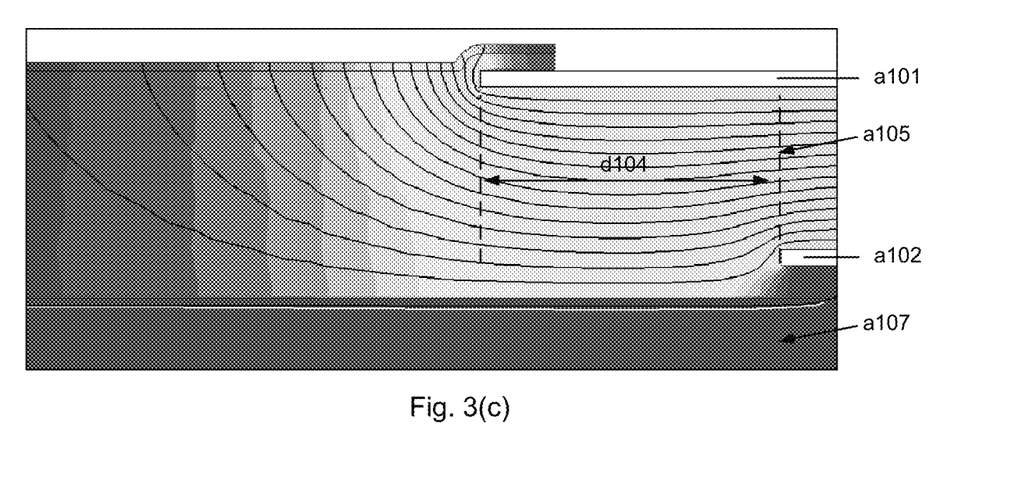
FIG. 3(c) illustrates a simulation of electrostatic potential distribution within a component where the first (top) electrode extends beyond the second (bottom) electrode, according to one embodiment of the disclosure.

FIGS. 3(a)-3(c) illustrate simulations of the distribution of electrostatic potential for different overlap between the first (top) electrode a101 and the second (bottom) electrode a102.

FIG. 3(a) illustrates a simulation of a component with symmetrical first (top) and second (bottom) electrodes. In HV components the distribution of electrostatic potential is not symmetrical in the vertical direction, because the doped substrate acts as a large extension of the bottom electrode. At the edges of the nodes the potential lines are bent differently for HV and LV nodes. The bending around the edge of the HV node is much tighter than around the edges of the LV node. Further, a tighter bending of the potential lines also comes along with decreased distances between them and therefore also with an increased strength of the electric field. In this example, the electrical field is maximum at the edge of the top electrode. This point is therefore weak and susceptible to electric breakdown. A too high local electric field will induce an electrical breakdown of the dielectric and subsequently of the whole HV component.

FIG. 3(b) illustrates a simulation of electrostatic potential distribution of a HV component where the second (bottom) electrode extends beyond the first (top) electrode. This has a further increased electric field at the edge of the top electrode, and so is more susceptible to dielectric breakdown.

FIG. 3(c) illustrates a simulation of electrostatic potential distribution of a HV component where the first (top) electrode extends beyond the second (bottom) electrode, according to an embodiment of the disclosure. The electrostatic potential distribution is influenced by shifting the electrode edges relative to each other: this is due to the field plate effect. In FIG. 3(c) the electric field at the edge of the top electrode is reduced, thereby improving electrical stability of the component. The difference between passivation and the bulk dielectric is that the passivation is the last layer in the stack. It is weaker than the bulk because potential distribution at the top surface is less controlled. Balancing the electric field distribution vertically within the component also helps to relief electrical stress from passivation, as the passivation is generally weaker than bulk material, thereby reducing unwanted effects such as surface discharge.

Figure 4:
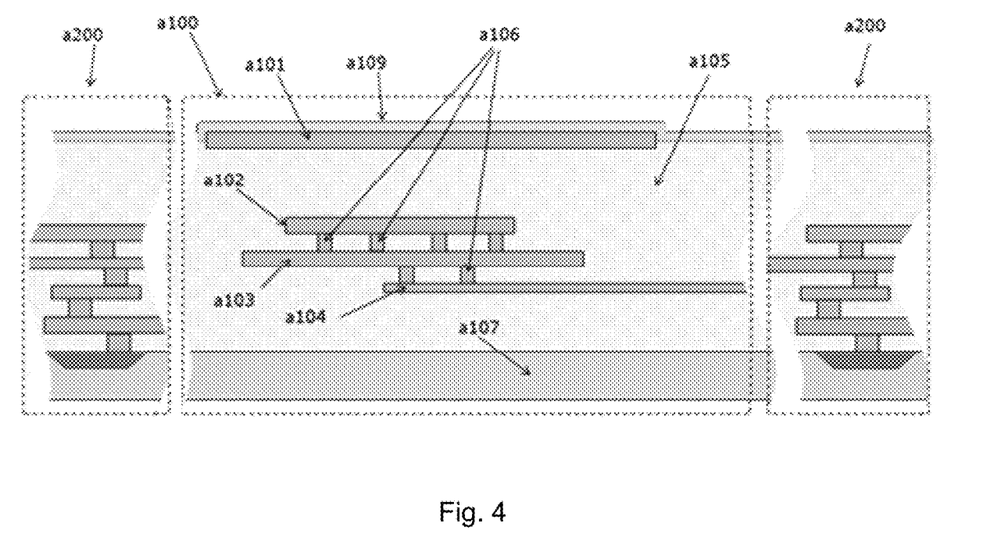
FIG. 4 shows a schematic illustration of a HV component, according to a further embodiment of the disclosure, in which the component includes a field plate on the second electrode.

FIG. 4 shows a schematic representation of a HV component a100, according to a further embodiment of the disclosure. In this embodiment, the component includes a HV node a101 and a LV node a102, a103, a104, a106 separated by a dielectric medium a105. The dielectric a105 can include SiN, SiO$_2$, or other dielectric materials or can be a combination of layers of different dielectrics. The dielectric a105 acts as the main isolating layer between the HV node a101 and the LV node a102, and may be implemented in different ways, e. g. in the form of a continuously deposited dielectric layer or as a stack of several inter-metal dielectric layers. The HV nodes a101 and the LV node a102, a103, a104, a106 are generally made from metal, polysilicon, or another conductive material. The HV component a101 can be surrounded by other parts of the chip a200 or even stay alone as a discrete device. The chip as a whole can be placed on a substrate a107 or can be substrate less. In this embodiment the LV node includes a LV main plate a102, a LV field plate a103, a connection to the contact pad a104, and connections between the plates a106. The connection to the contact pad a104 is implemented in a separate layer, however can be in the same layer as the field plate a103. The main plate a101 may be contacted directly by wire bonding through an opening in the passivation a109. The additional field plates lead to the redistribution of the electric field from the "hot spots" over the other part of the structures.

Figure 5:
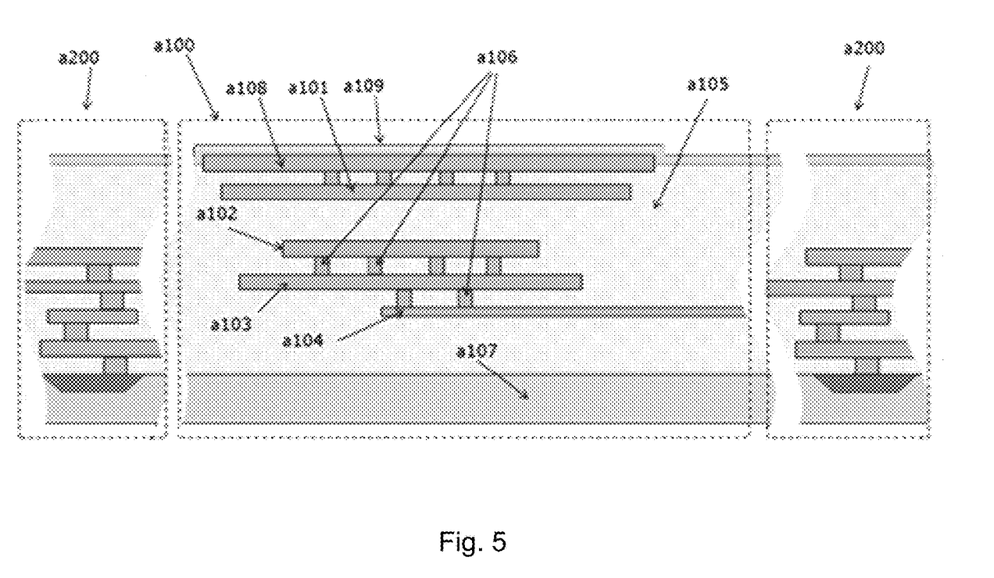
FIG. 5 shows a schematic illustration of a HV component, according to a further embodiment of the disclosure, in which the component includes a field plate on the first electrode.

FIG. 5 shows a schematic representation of a HV component a100 according to a further embodiment of the disclosure. In this embodiment the HV node includes a main plate a101 and a field plate a108. The field plate a108 may be contacted directly by wire bonding through an opening in the passivation a109. The LV node includes a main plate a102, a field plate a103, a connection to the contact pad a104, and a connection between the plates a106. An additional reduction of the electric field at the HV node's main plate edge a101 is achieved by the introduction of the field plate a108 to the HV node. The function of the field plate a108 is similar to that described for the LV field plate a103, but the electric field will be reduced at the HV node's main plate a101 in this case. In FIG. 5 the HV node's field plate a108 is used in combination with the LV node's field plate a103. but may also be used separately.

Figure 6:
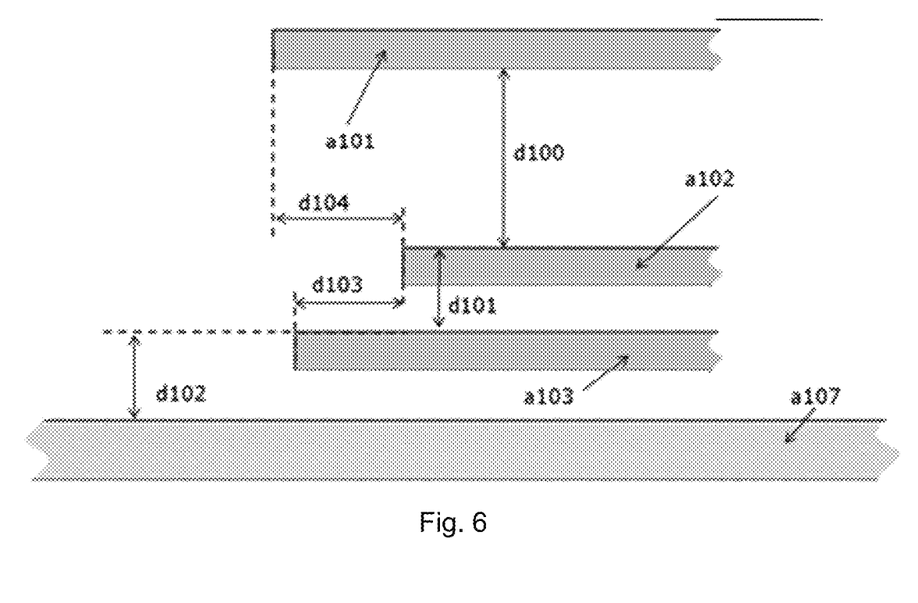
FIG. 6 shows a schematic representation illustrating the geometrical dimensions in the HV component of FIG. 4.

FIG. 6 shows a schematic representation illustrating the geometrical dimensions in the HV component of FIG. 4. The thickness d100 of the dielectric between the HV node and the LV node a105 is shown in FIG. 6. The thickness d100 may be about 3 μm or more. The distance d101 is between the top edges of the main plate of the LV node a102 and the field plate a103. The distance between the top edge of the LV field plate a103 and the surface of the substrate a107 is described by d102. The lateral extension of the LV field plate a103 beyond the LV node's main plate a102 is shown as d103. The distance d104 describes the lateral extension of the main plate of the HV node a101 over the edge of the main plate of the LV node a102. The field plate a103 of the LV node allows a reduction of the electric field at the edge of the main plate a102 of the LV node for higher values of d104 while the reduced electric field at the edge of the HV node a101 is maintained. With a certain positive overlap d103 over the edge of the main plate a102, the field plate is able to reduce the electric field at the edge of the main plate a102. The electric field at the edge of a101 increases only marginally as long as d103 is configured at a distance that is not too large. In other words, the field plate a103 of the LV node does not extend further than the HV node.

Figure 7:
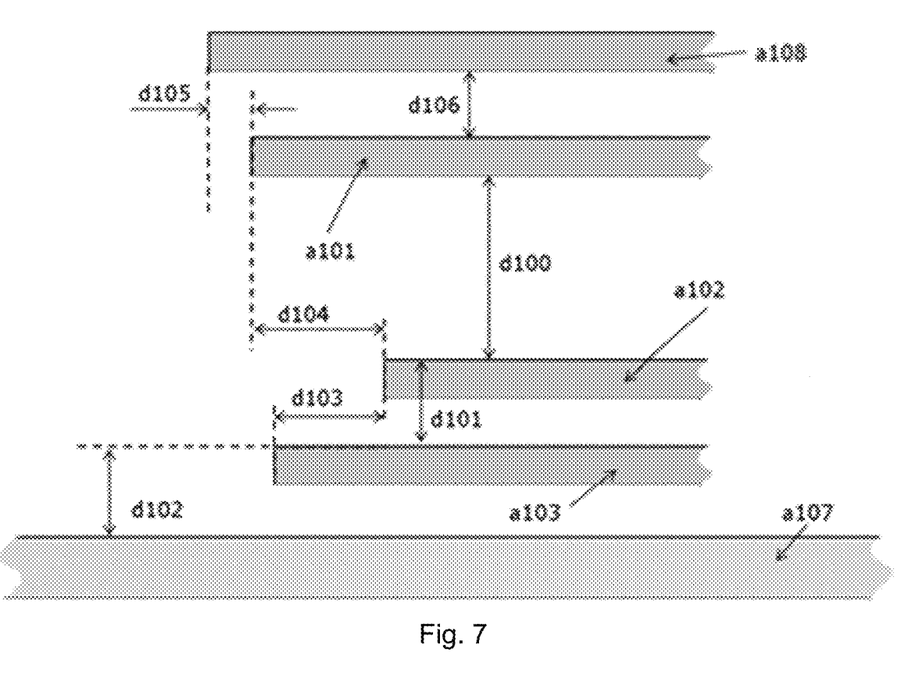
FIG. 7 shows a schematic representation illustrating the geometrical dimensions in the HV component of FIG. 5.

FIG. 7 shows a schematic illustrating the geometrical dimensions in the HV component of FIG. 5, in which a field plate a108 is implemented for the HV node. The extension of the HV node field plate a108 over the edge of the HV node main plate a101 is shown as d105. The concrete value of the overlap d105 of the HV field plate a108 over the HV main plate a101 depends on the overall design of the HV component including the thickness of the dielectric d100, the distance between HV main and field plate d106, and the type of the substrate a107, among other factors.

Figure 8:
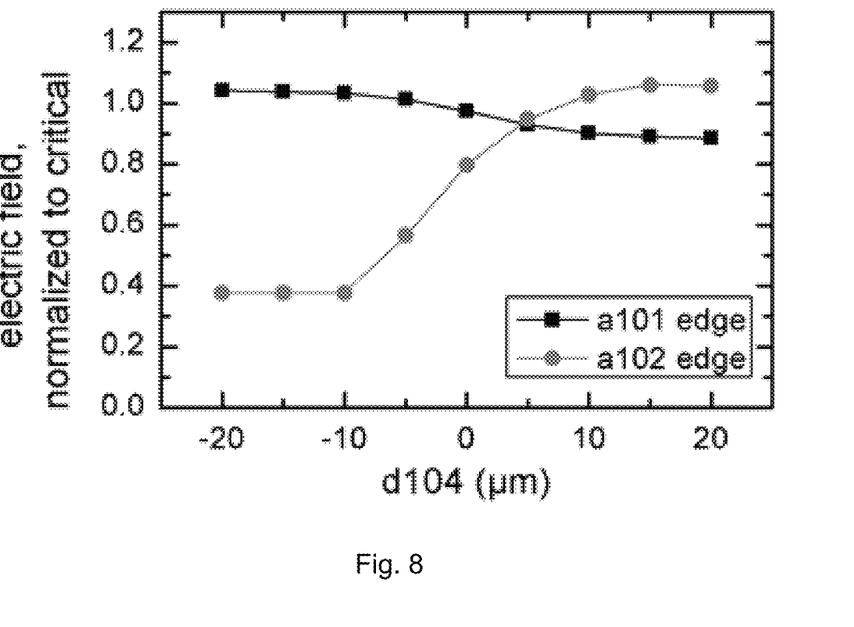
FIG. 8 shows results of the simulated dependency of the electric field at the edges of the electrodes of FIG. 2, on the overlap between the second and first electrodes.

FIG. 8 shows the simulated dependency of the electric fields at the edges of a101 and a102 on the overlap d104 between the HV node a101 and the LV node a102. From this graph it can be seen that the optimal overlap were the two lines cross and the electrical field becomes lowest can be found for some positive overlap d104. in other words the HV node's main plate a101 overlaps the LV node's main plate a102. The concrete value of the overlap d104 depends on the height d107 of the LV node main plate a102 over the substrate a107 as well as the conductivity of the selected substrate a107 and the thickness d100 of the dielectric a105. For larger overlaps d104 above 5 μm the electric field at the edge of the LV node's main plate a102 becomes higher and a breakdown will be induced there. It is also visible that the electric field at the edge of a101 decreases further with increasing d104. For the example shown in FIG. 8, the dielectric a105 has a thickness d100 of 11 μm, the LV node's main plate a102 is formed in the second metal layer with a distance to the substrate d107≈4 μm and the optimum overlap d104 is approximately 5 μm.

Figure 9:
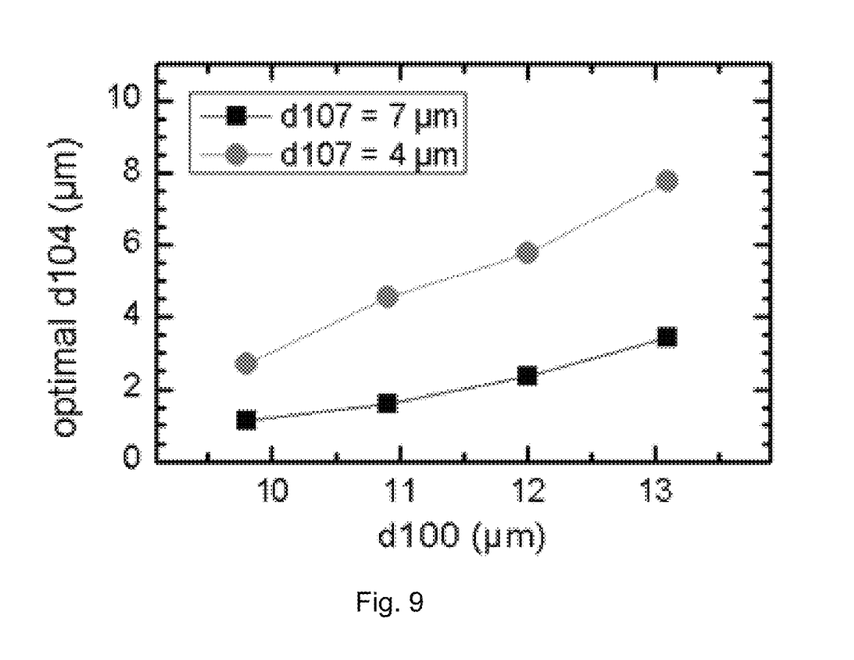
FIG. 9 shows simulated results of an optimal value of overlap between the second and first electrodes of FIG. 2, for different dielectric thicknesses, and for different heights over the substrate.

FIG. 9 shows the optimal value of d104 for different dielectric thicknesses d100 and for two different heights over the substrate d107. From this, it can be seen that for thicker dielectrics and lower heights d107 a larger overlap d104 is required to obtain the highest isolation strength for the HV component.

Figure 10:
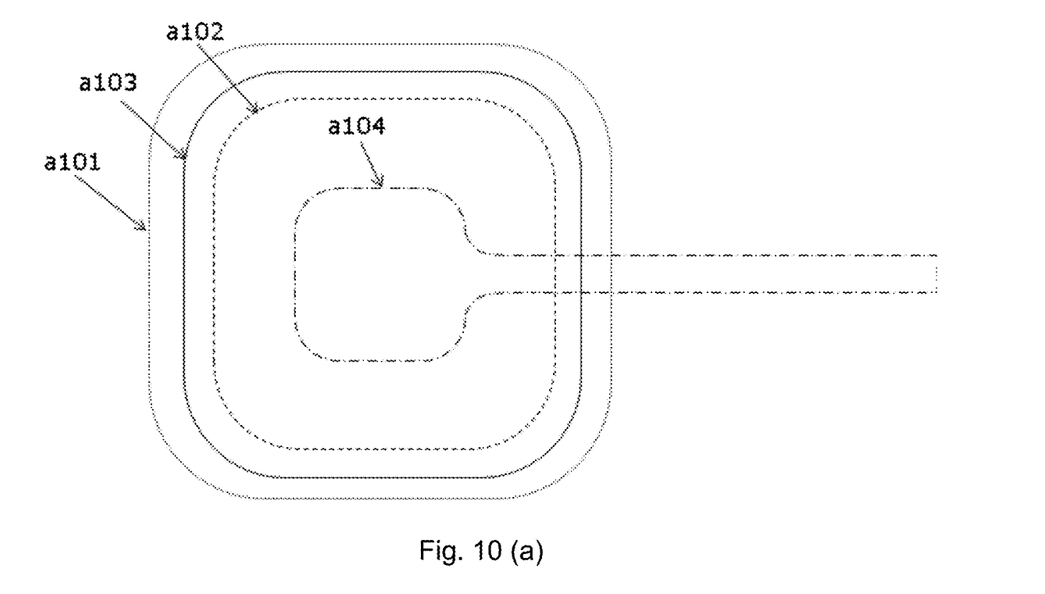
FIG. 10(a) illustrates an embodiment of a capacitor layout in which the plates have rounded corners.
FIG. 10(b) illustrates an embodiment of a capacitor layout in which the plates have a circular shape.
Figure 11:
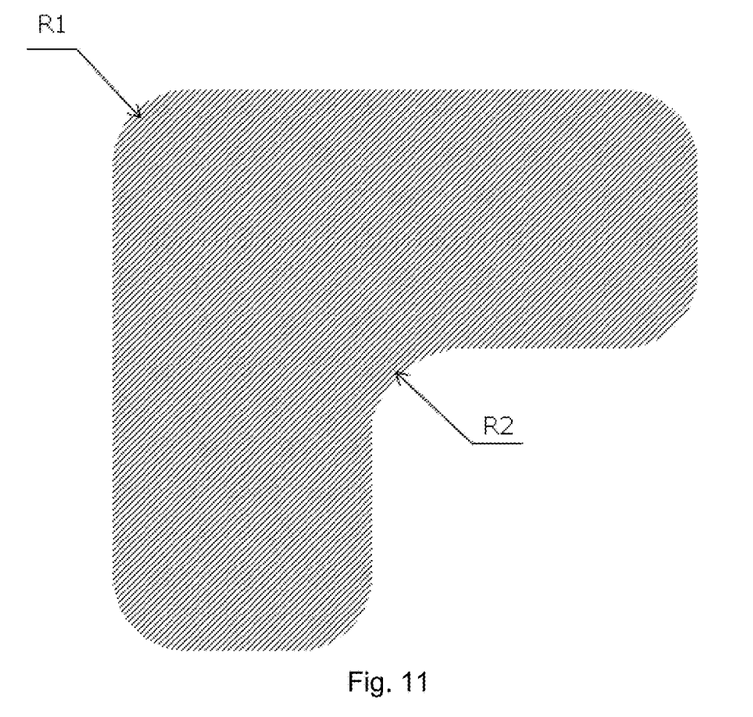
FIG. 11 shows a figure illustrating the definition of corner radius.

FIGS. 10(*a*)-10(*b*) illustrate a plan view of examples of capacitor design. This shows a cross section of the structure is shown at FIG. 4. It can be seen that all corners are rounded. FIG. 10(*a*) shows a first embodiment where the corners are rounded. FIG. 10(*b*) shows a further embodiment where a circle shape is used to make nodes and plates. The reduction in electrode field is greatest when the maximum radius of the rounding is achieved for the given structure size. The radius of rounding is shown in FIG. 11. This is because the electric field at the corner of the plates is proportional to the corner radius to the power −1, in other words E~1/R. This applies to the shape of the nodes, plates and other parts of the device which are conductive (for example the connection between nodes and contact pads).

It may not be feasible to use a circle shape for the plates and nodes, however improvement in electrode field can occur for radius of rounding defined as R1>20 um and R2>5 um, as shown in FIG. 11.

In the embodiments of 10(*a*) and FIG. 10(*b*), the overlap of the field plates is the same over the whole structure to avoid non uniform field redistribution and to not create a "hot spot" of the electric field.

Figure 12:
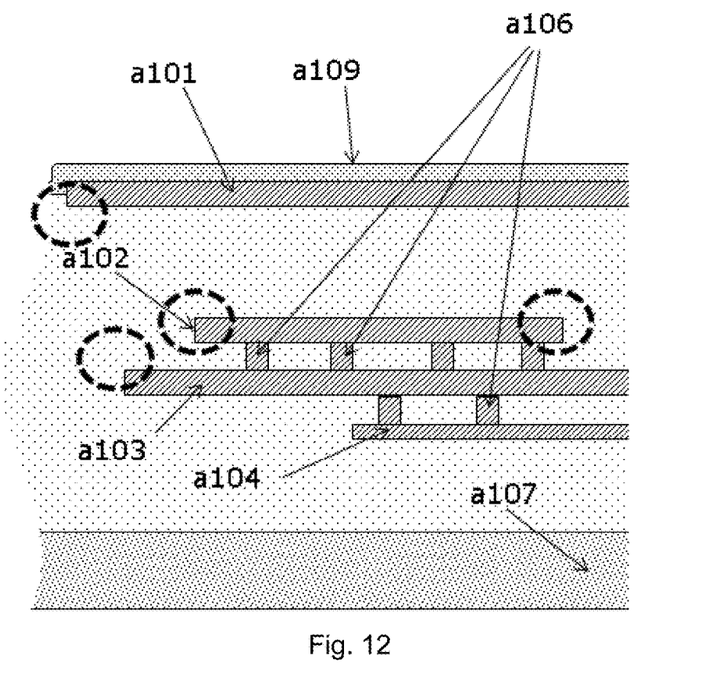
FIG. 12 illustrates the positions of electric field "hot spots" vertically within a component according to one embodiment.

FIG. 12 illustrates the positions of the electrical field "hot spots" vertically within a component according to one embodiment. These positions show where the greatest electric field can be found and where the corner rounding would reduce electric field. A reduction in sharp corners in the vertical direction improves electric field distribution.

Figures 13A, 13B, 13C:
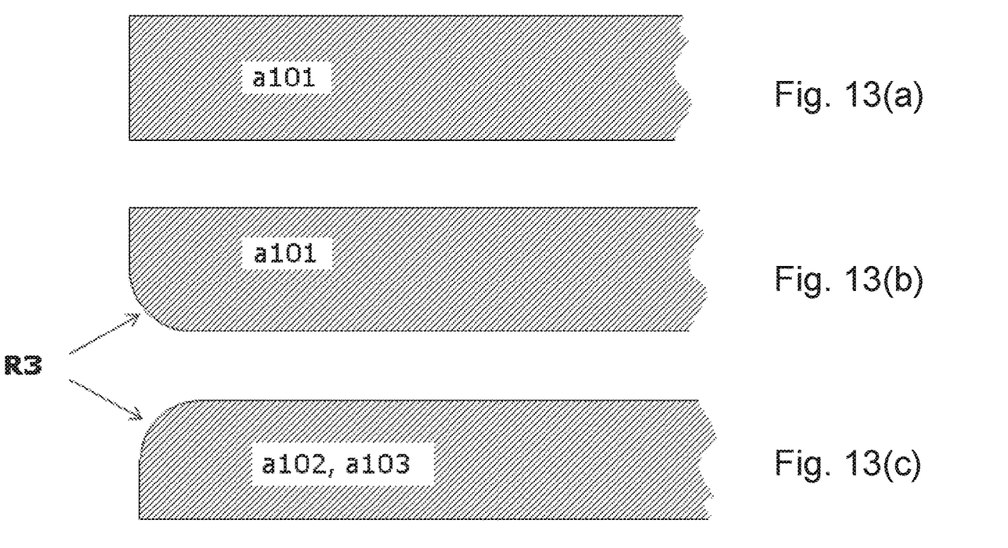
FIG. 13(a) illustrates a plate with no vertical rounding of corners.
FIGS. 13(b) and 13(c) illustrate plates with rounded corners of the sides of plates that are oriented in the direction facing the opposite plate.

FIGS. 13(*a*)-13(*c*) illustrate different shapes of main plate and field plate corners. Due to the relation between electric field and corner radius (E~1/R). the sharp corners of FIG. 13(*a*) do not improve electric field distribution. Rounding of the corners of the node sides oriented in the direction facing the opposite plate or node improves electric field distribution, as in the device design shown in FIGS. 13(*b*)-13(*c*). Electric field reduction improves with as radius R3 increases. The rounding may be achieved, for example, by tuning the metal etching process when the metal is used for the plates or nodes.

The skilled person will understand that in the preceding description and appended claims, positional terms such as 'above'. 'overlap'. 'under', 'lateral', etc, are made with reference to conceptual illustrations of an device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A high voltage device comprising:
 a first electrode;
 a second electrode disposed underneath and spaced from the first electrode; and
 a dielectric layer disposed between the first and second electrodes,
 wherein the first electrode extends further in at least one lateral direction in respect of the second electrode,
 wherein the device further comprises a first field plate electrically connected to one of the first electrode or the second electrode, and
 wherein the first field plate is spaced from the first and second electrodes in a vertical direction.

2. A device according to claim 1, wherein the first electrode comprises a first portion and a second portion, and wherein the first portion is located above the second electrode, and wherein the second portion is not located above the second electrode.

3. A device according to claim 1, wherein the first electrode and the second electrode comprise capacitor plates.

4. A device according to claim 1, wherein the first electrode and the second electrode comprise transformer coils.

5. A device according to claim 1, further comprising a semiconductor substrate located under the second electrode.

6. A device according to claim 5, wherein the substrate is electrically floating.

7. A device according to claim 5, wherein the substrate is electrically connected to the second electrode.

8. A device according to claim 1, wherein the first electrode is configured to be biased at a higher absolute voltage than the second electrode.

9. A device according to claim 1, wherein the first field plate extends further in at least one lateral direction in respect to the one of first electrode or the second electrode.

10. A device according to claim 1, further comprising a second field plate electrically connected to the other of the first electrode or the second electrode; and optionally
 wherein the second field plate extends further in at least one lateral direction in respect to the other of the first electrode or the second electrode.

11. A device according to claim 1, further comprising a passivation layer located above the first electrode.

12. A device according to claim 1, wherein the device is manufactured using a CMOS compatible process.

13. A device according to claim 1, wherein at least one electrode comprises a rounded corner in a vertical direction.

14. A device according to claim 13, wherein a corner on a lower edge of the first electrode has a rounded shape, and wherein a corner on an upper edge of the second electrode has a rounded shape.

15. A device according to claim 1, wherein at least one electrode comprises a rounded corner in a lateral direction.

16. A device according to claim 1, wherein at least one electrode has a substantially circular shape in a lateral dimension.

17. A device according to claim 1, wherein the first electrode and the second electrode have a geometrically similar shape in a lateral dimension; and optionally wherein the first electrode and the second electrode are arranged concentrically in a lateral dimension.

18. A device according to claim 1, wherein the device is a galvanic isolation device.

19. A method of manufacturing a high voltage semiconductor based device, the method comprising:
   forming a first electrode;
   forming a second electrode disposed underneath and spaced from the first electrode; and
   forming a dielectric layer disposed between the first and second electrodes;
   wherein the first electrode extends further in at least one lateral direction than the second electrode,
   wherein the device further comprises a first field plate electrically connected to one of the first electrode or the second electrode, and
   wherein the first field plate is spaced from the first and second electrodes in a vertical direction.

* * * * *